(12) United States Patent
Pula et al.

(10) Patent No.: US 11,908,637 B2
(45) Date of Patent: Feb. 20, 2024

(54) SYSTEM AND METHOD FOR A REPLACEMENT TOUCHLESS BUTTON

(71) Applicant: Smithsonian Institution, Washington, DC (US)

(72) Inventors: Timothy Pula, Fredericksburg, VA (US); Geoffrey Moore, Arlington, VA (US)

(73) Assignee: Smithsonian Institution, Washington, DC (US)

( * ) Notice: Subject to any disclaimer, the term of this patent is extended or adjusted under 35 U.S.C. 154(b) by 101 days.

(21) Appl. No.: 17/576,486

(22) Filed: Jan. 14, 2022

(65) Prior Publication Data
US 2022/0230820 A1 Jul. 21, 2022

Related U.S. Application Data

(60) Provisional application No. 63/138,042, filed on Jan. 15, 2021.

(51) Int. Cl.
| | | |
|---|---|---|
| *H01H 11/00* | (2006.01) | |
| *H03K 17/945* | (2006.01) | |
| *G06F 3/02* | (2006.01) | |

(52) U.S. Cl.
CPC .......... *H01H 11/00* (2013.01); *G06F 3/0202* (2013.01); *H03K 17/945* (2013.01); *H01H 2229/022* (2013.01); *H03K 2017/9455* (2013.01)

(58) Field of Classification Search
CPC .............. H01H 11/00; H01H 2229/022; G06F 3/0202; G06F 3/0393; G06F 3/0338; H03K 17/945; H03K 2017/9455
See application file for complete search history.

(56) References Cited

U.S. PATENT DOCUMENTS

| | | |
|---|---|---|
| 8,324,518 B2 | 12/2012 | Furrer |
| 8,890,846 B2 | 11/2014 | Rostamianfar et al. |
| 2013/0049929 A1 | 2/2013 | Gerlack |
| 2014/0028378 A1 | 1/2014 | Rostamianfar et al. |
| 2019/0261492 A1* | 8/2019 | Chen ................... H05B 47/115 |

(Continued)

OTHER PUBLICATIONS

International Search Report and Written Opinion issued in PCT/US2022/012539 dated May 16, 2022.
(Continued)

*Primary Examiner* — Amit Chatly
(74) *Attorney, Agent, or Firm* — William N. Hughet; Melissa M. Hayworth; E. Joseph Gess

(57) ABSTRACT

Systems and methods for providing a replacement touchless button for initiating an action upon proximate detection of a solid object near the top of the touchless button. The action is triggered by determining that the solid object is within a predetermined distance from the top of the button. The action is accomplished by the closing of an electrical circuit within the touchless button, the button being configured to replace a push button without modification of a panel housing the push button. The button contains and supports, within its structure, all electrical and physical components needed to operate a device that can be triggered via a push button. The button serves as a direct replacement for a push button with no modifications to existing systems or controls regularly triggered by a push button.

8 Claims, 11 Drawing Sheets

(56) References Cited

U.S. PATENT DOCUMENTS

2021/0396883 A1* 12/2021 Jacobson, III ....... G02B 6/0001
2022/0205277 A1*  6/2022 Leiponis ............. E05B 47/0046

OTHER PUBLICATIONS

Norton Touchless Solutions: How to Convert a Push Button to Wave Switch, Norton Door Controls (Norton Rixson Door Controls) Oct. 23, 2020 https://www.youtube.com/watch?v=FprilYQZiqs.

* cited by examiner 106  102                    104              108

SYSTEM AND METHOD FOR A REPLACEMENT TOUCHLESS BUTTON

CROSS-REFERENCE TO RELATED APPLICATIONS

This patent application claims the benefit of U.S. Provisional Patent Application No. 63/138,042, filed Jan. 15, 2021, the contents of which are incorporated herein by reference in their entirety.

BACKGROUND

The spread of COVID-19 since December, 2019 significantly raised concerns about disease transmission from frequently touched surfaces. In the past 3 decades, museums, science centers, and other public spaces have added diverse "interactives," many of which operate through push button activation. In recent years, these same institutions have aspired to improve their universal access, reducing technology interfaces that are difficult for people in wheelchairs to reach or for people with prosthetics to interact with. Push buttons are utilized to control and activate many features in day-to-day life, from lighting, elevator floor selection, information presentation, options selection, and operation of vehicles. Activation of a feature controlled by a push button requires precise physical engagement by a user to correctly engage and activate the push button.

What is needed is a replacement button that resolves the problems associated with push buttons, including a button that can replace push buttons without any modification of the housing in which the push button is located. It is also important that replacement of the button require little or no additional system modifications, either electrical or control panel related.

SUMMARY

This summary is provided to present a selection of concepts that are further described in greater detail below in the Detailed Description. This summary is not intended to identify important or required features of the claimed subject matter, nor is it intended to establish the scope of the claimed subject matter.

According to certain embodiments, a method is provided for a replacement touchless button for initiating an action, the method including identifying a push button configured to initiate an action, wherein the identified push button completes an electrical circuit for initiating the action; determining a diameter of an orifice in which the push button is housed; determining a diameter of a selected touchless button; determining a sizing washer for covering the space between an outside wall of the selected touchless button and an inside wall of the orifice, wherein the sizing washer comprises a central opening sized to accept the touchless button. The method further provides for placing the touchless button into the central opening of the sizing washer; placing the touchless button in the orifice, wherein the sizing washer covers the space between the outside wall of the touchless button and the inside wall of the orifice; and connecting the touchless button with the electrical circuit.

Additional embodiments are directed to a system for providing a replacement touchless button for initiating an action, including a housing structure containing mechanical components and electrical components configured to close an electrical circuit upon sensing proximity of a solid object near the touchless button; wherein the mechanical components include a button top permitting sensing of the proximity of a solid object; and a switch closing the electrical circuit, thereby initiating an action. All of the components needed to operate the functionality of the button are located proximate to the button. There are no needed external control units, processors, relays, or converters. All controls, feedback, and logic components are present at the site of the button when it is installed. The electrical components can include one or more processors configured to execute program instructions; memory optionally coupled to the one or more processors, for storing the program instructions for execution by the computer processor; electrical connections connecting the touchless button to a power source; and a sensor detecting the proximity of a solid object to the button top, switching components to activate a signal or device associated with the button, including transmitting a signal for activating or controlling a device located external to and remote from the button. The processor is responsive to the stored program instructions and operative to detect, from the sensor, an approaching of a solid object; determine whether the solid object is within a predetermined distance from the top of the button; and, upon determining that the solid object is within the predetermined distance from the top of the button, close the electrical circuit, thereby initiating an action associated with the touchless button.

Embodiments of this technology provide significant benefits over existing technologies in that it can provide a direct size fit replacement for existing push buttons and the above-mentioned technologies. By providing a direct physical fit button/switching replacement, no modifications to existing mounting structures, panels, or housings are needed. For example, in circumstances where a push button is located in a panel constructed of thick or resilient material, such as a thick glass panel, reworking the panel to provide for a replacement button would be both challenging and undesirable. Using the technologies disclosed in this application would avoid such reworking of the panel and permit easy replacement of the push button. The replacement touchless button can tap into existing trigger wiring and can be powered by existing low voltage power sources, including USB. The button can also be powered by AC power sources by utilizing and AC to DC transformer power supply. Additionally, power can be provided to the button through an inverter or a wireless power source.

Additionally, the design of one or more embodiments mimic existing arcade style push buttons in size and shape, thereby creating a relatively intuitive interface. The proximity sensor used in one or more embodiments allows for a narrow touchless contact point while also providing installers and staff the ability to fine tune the distance of the trigger zone from 10 cm to 1 m. Current embodiments can utilize sizing washers to fit any button hole 19.5 mm in diameter up to 35 mm in diameter.

The touchless replacement button described in the various embodiments below addresses many of the limitations of existing push buttons, reduces disease transmission, and increases access to the features activated by the button. Further, by replacing mechanical contacts with sensors, physical fatigue and wear and tear found in traditional push buttons, especially those buttons in high use and in high volume public spaces (such as in museums and other display venues), is reduced and life of the buttons is extended.

The methods and apparatuses of the present invention have other features and advantages which will be apparent from or are set forth in more detail in the accompanying drawings, which are incorporated herein, and the following Detailed Description, which together serve to explain certain principles of the present invention.

BRIEF DESCRIPTION OF THE DRAWINGS

The present invention has other features and advantages which will be apparent from or are set forth in more detail in the accompanying drawings, which are incorporated herein, and the following Detailed Description, which together serve to explain certain principles of the present invention and to enable a person of ordinary skill in the art to make and use the embodiments disclosed herein. In the drawings, like reference numbers indicate identical or functionally similar elements.

It should be understood that the appended drawings are not necessarily to scale, presenting a somewhat simplified representation of various features illustrative of the basic principles of the invention. The specific design features of the present invention as disclosed herein, including, for example, specific dimensions, orientations, locations, and shapes can be determined in part by persons of ordinary skill in the art for the particular intended application and use environments.

DETAILED DESCRIPTION

Figure 1:
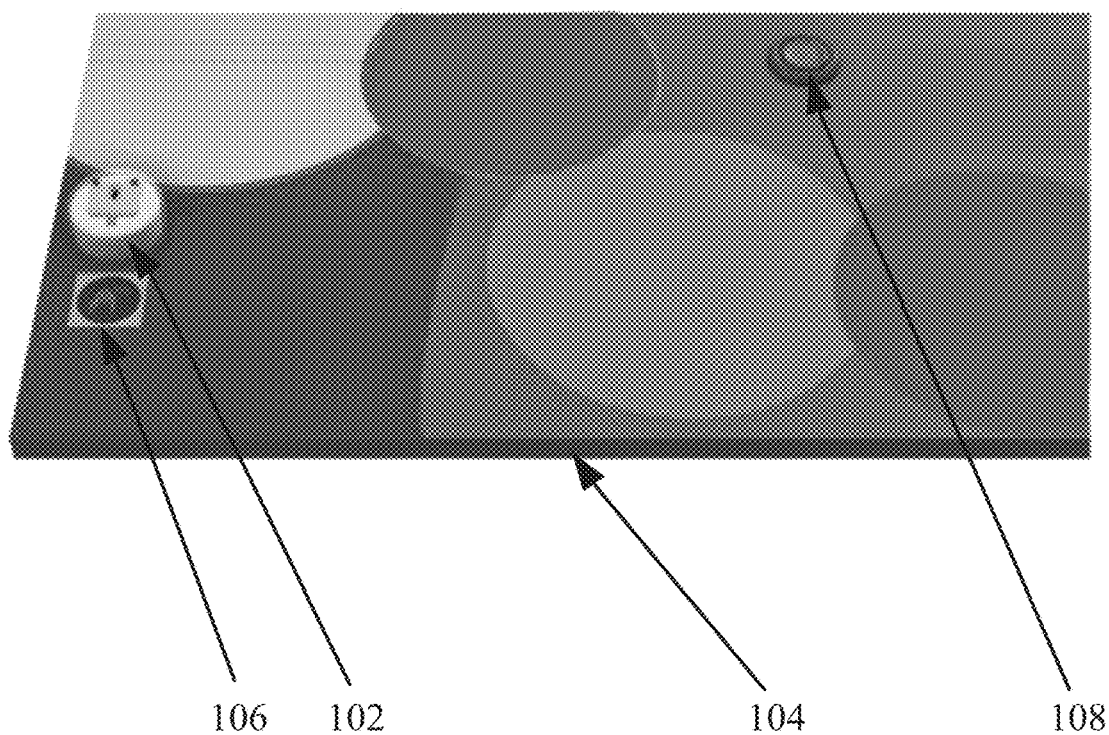
FIG. 1 illustrates an exemplary replacement touchless button and an exemplary push button, each button located in an exemplary display board.
Figure 2:
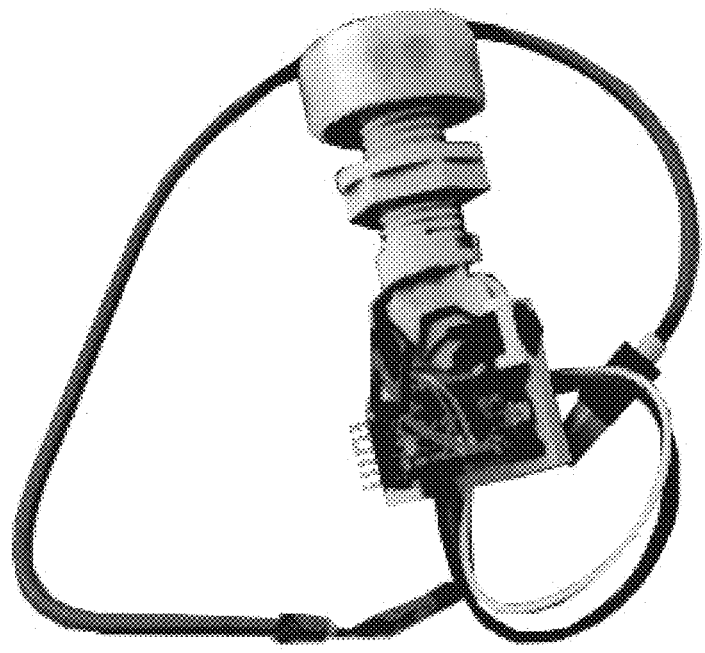
FIGS. 2-4 illustrate different perspectives of an exemplary replacement touchless button.
Figure 3:
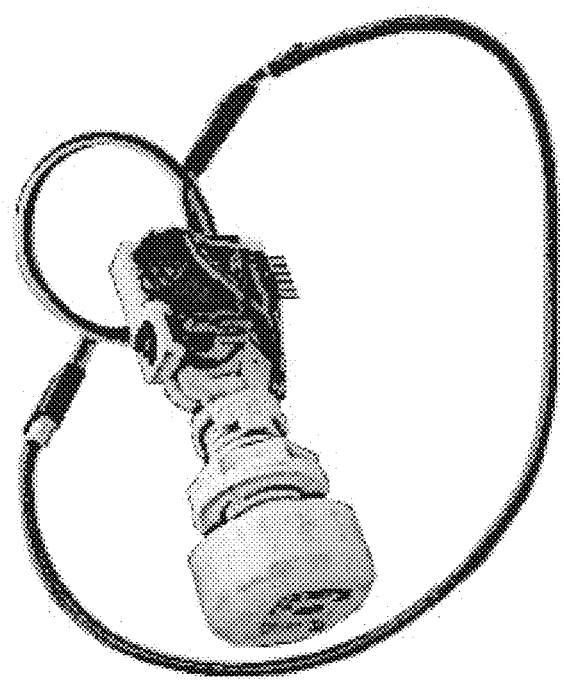
Figure 4:
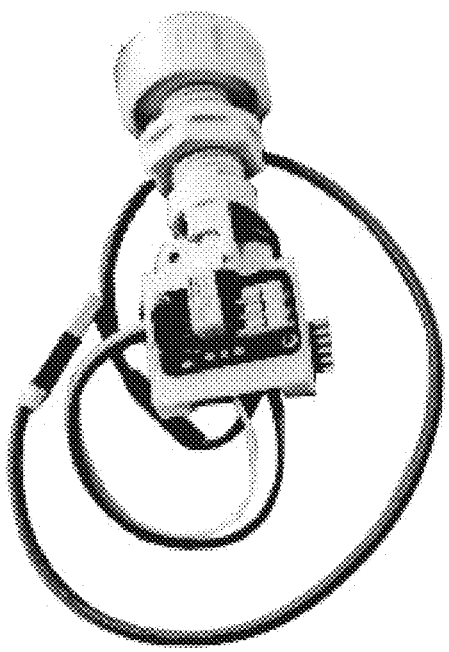
Figure 5:
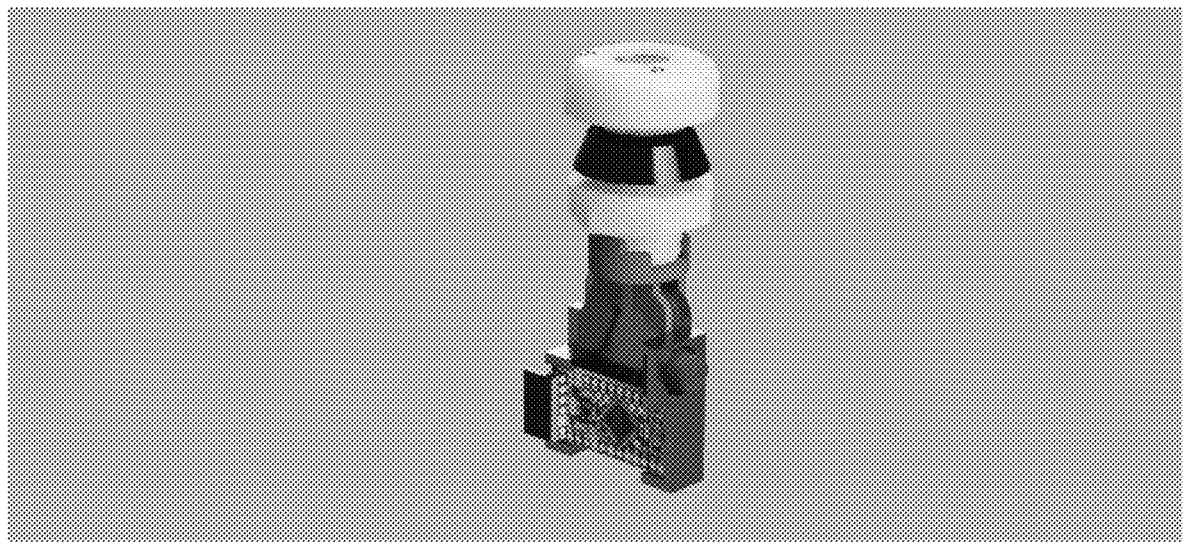
FIG. 5 illustrates an exemplary replacement touchless button, including the touchless button.

Although the described embodiments can be implemented in any appropriate type of panel, display board, housing, or plate, particular embodiments can be implemented in an exemplary display board such as shown in FIG. 1.

The disclosed touchless replacement button is a direct replacement interface for arcade style and similar haptic push buttons. It is designed so that the installer/technician can easily fit the touchless button directly into existing openings without modification to the surface that previously held the push button. The physical structure of the system aspects of this technology allows for a physical direct replacement fit of such buttons. The diameter of the fit can be easily adapted using a sizing washer. The button's electronic components allow for ease of connection utilizing existing contact closure wiring. It can be powered through a source of low voltage power via a plug, a USB cable, or AC via an AC/DC power converter. All of the components (including electronic logic, memory, storage, firmware, software, switching, and indication components) required to make the touchless button functional are built into or attached to the button housing and its associated structures. These embodiments use a precise range finding sensor, currently with a range of 10 cm to 1 m, and a field of view currently at or about 22 mm in diameter for sensing proximity or motion. This design enables use by people of varying height, reach, and mobility, with or without prosthetics, and of varying physical abilities to activate the feature controlled by the touchless button. The button has a sufficiently similar appearance to a typical arcade style push button such that its mode of use can likely be determined as being familiar to most people. This appearance coupled with an optional feedback sensation, visible light, or audible sound provides a relatively intuitive interface. The technology of the replacement touchless button includes the physical alternative to the housing of the push button, all input and output components, and the program code to operate the button as a touchless interface. Alternately, the touchless button can be utilized as the original button for placement or installation in a panel or device for initiating an action, signaling a device, or controlling a device.

As a finger, hand, hand-held pointer, or prosthetic (any of which are a "solid object") approaches the touchless button, an audible tone, visible light, and/or haptic sensation can be initiated or activated as feedback. The sound, light, and/or haptic feedback of the touchless button, along with the functionality of its sensor, are intended to make it accessible to any user and to make the user aware device control or activation through the touchless button is occurring. In particular, the output of the touchless button will provide audible, visual, and/or haptic feedback to the user (in addition, of course, to the device action that the button produces).

As the solid object moves closer to the button, the light, audible tone, and/or haptic signals can change corresponding to the distance of the solid object. When the solid object reaches a predetermined distance, set by the installer or by staff, the light, audible tone, and/or haptic signal can change again to indicate a touchless button press. At this point the relay on the touchless button will complete the circuit and initiate the action or control previously activated by the push button.

The top of the touchless button (the part seen by users), is comparable in size to a standard push button. The touchless button is also configured to be similar in its distance to the mounting surface as a push button. In its current form, the cap of the touchless button can be semi-transparent, making the sensor board and associated visual feedback visible to users. The touchless button is designed to look similar enough to a push button to be relatively intuitive to use, while looking different enough to not elicit physical contact.

Figure 6:
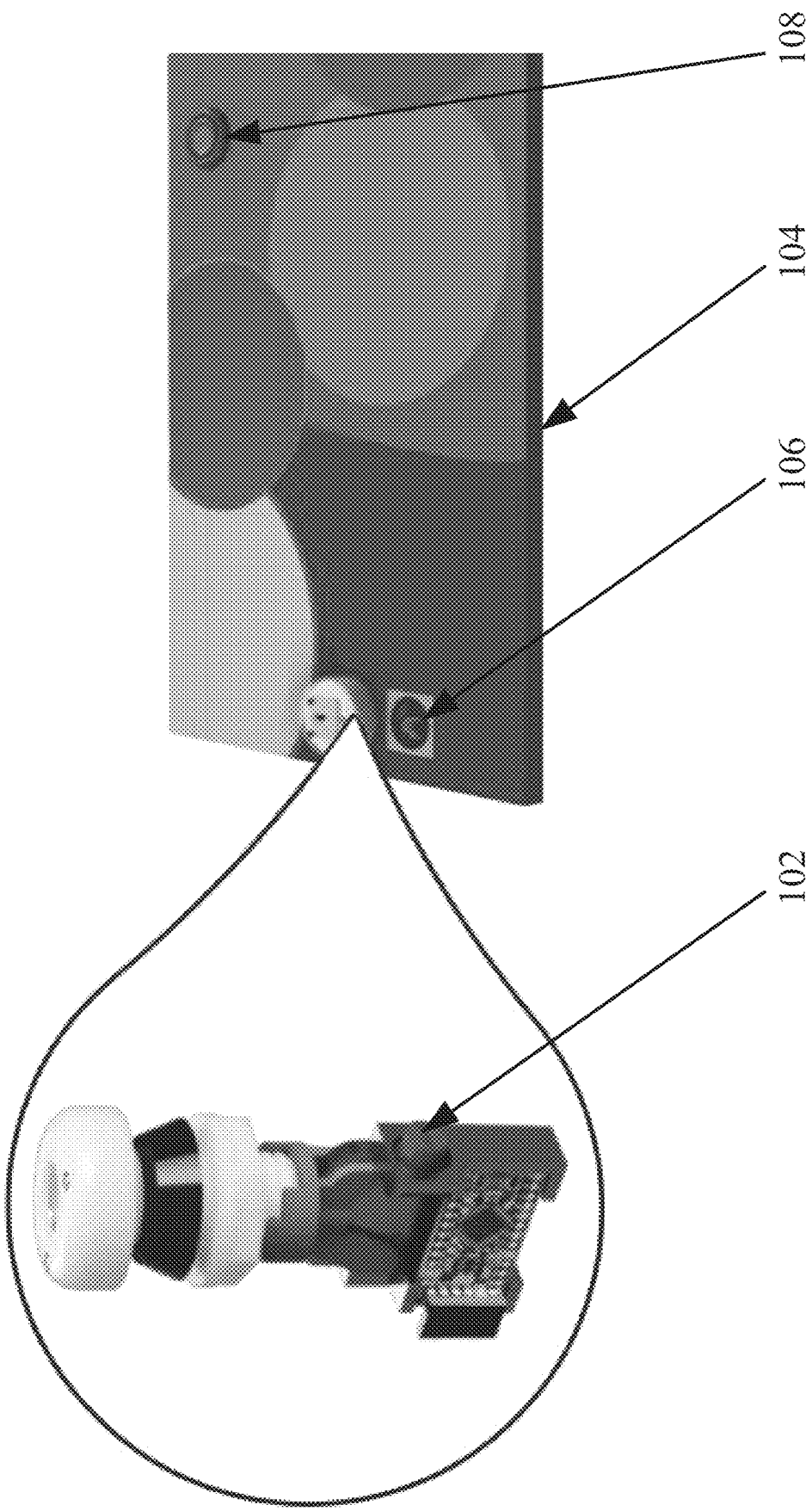
FIG. 6 illustrates placement of an exemplary replacement touchless button in a display panel.
Figure 7:
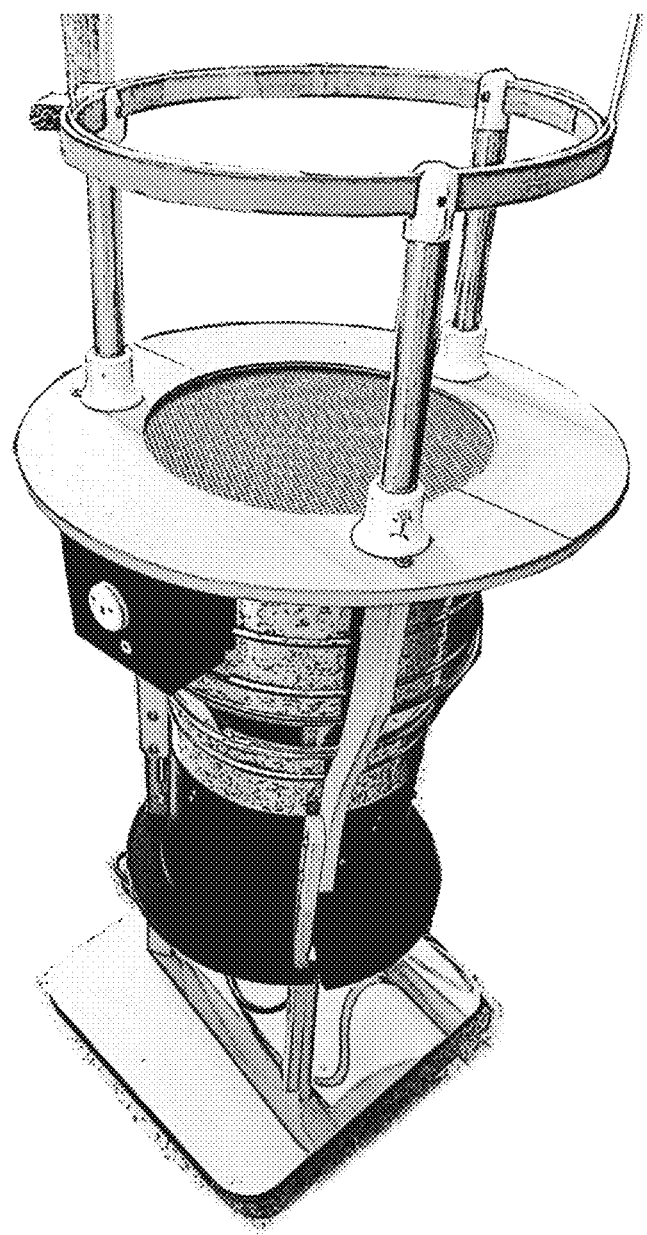
FIGS. 7-9 illustrate placement and use of an exemplary replacement touchless button in an exemplary device, namely a vertical wind tunnel.
Figure 8:
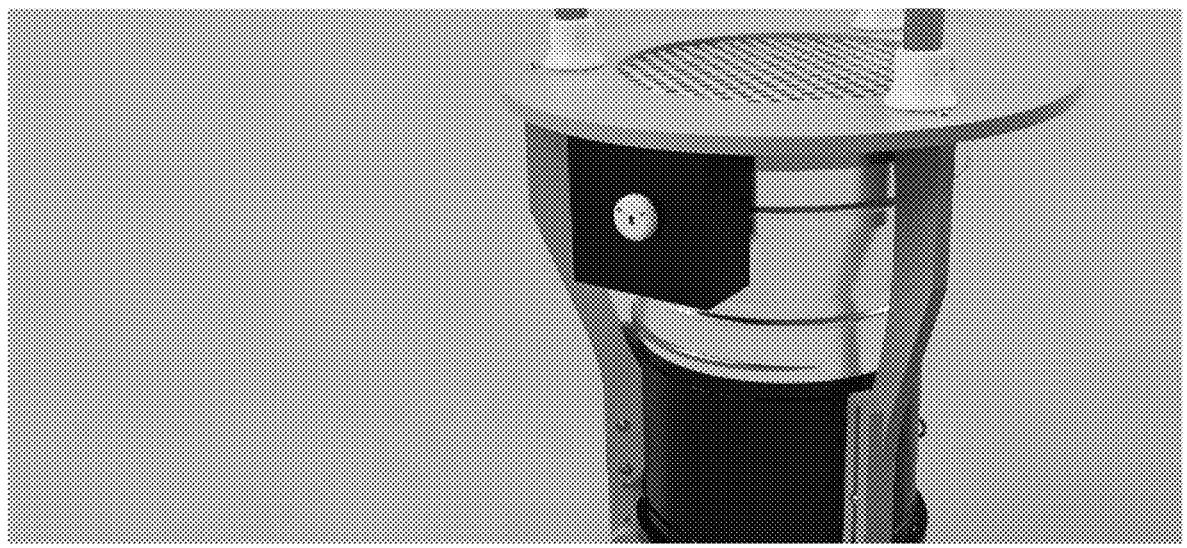
Figure 9:
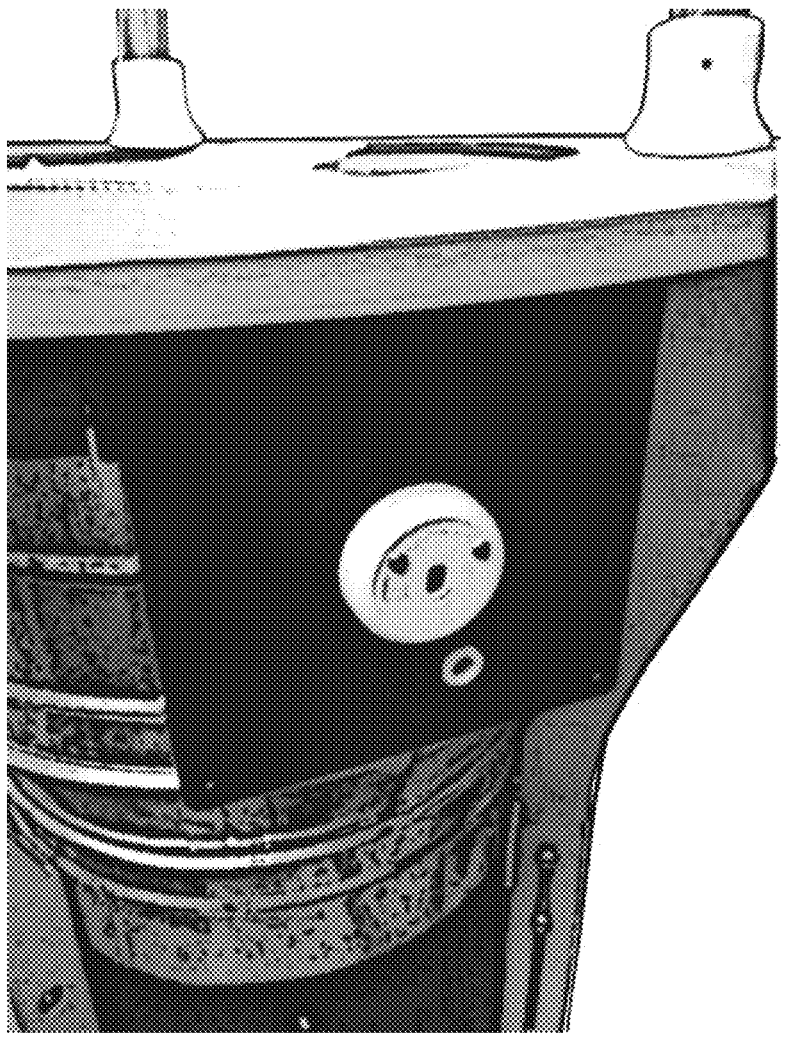

Referring to FIG. 1, there is shown an exemplary touchless button 102 at the Urban Nests label, with a "use graphic" designation 106 below the button 102 on the panel 104. A standard arcade style push button 108 is shown next to the Mud Nests label on the panel 104. FIG. 6 shows graphically the replacement of an alternate embodiment of a touchless button 102 at the Urban Nests location of the panel 104. FIGS. 2-5 show several views of an exemplary replacement touchless button. FIGS. 7-9 show a replacement touchless button having been replaced for a push button in a vertical wind tunnel, as an exemplary application of the replacement touchless button.

To install this invention, the installer would disconnect the wiring for the existing push button, remove the existing push button, choose the correct sizing washer, if needed, for their application, place this invention in the mounting hole previously occupied by the push button, and connect the touchless button to the existing wiring connections.

Figure 10:
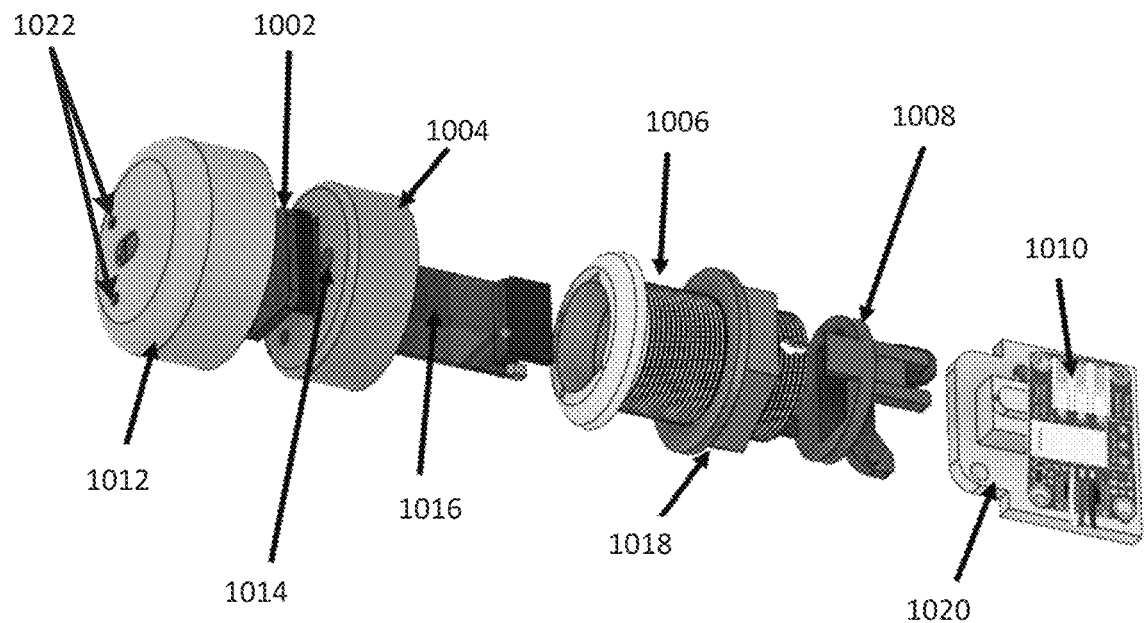
FIGS. 10-12 illustrate exploded views of an exemplary replacement touchless button.
Figure 11:
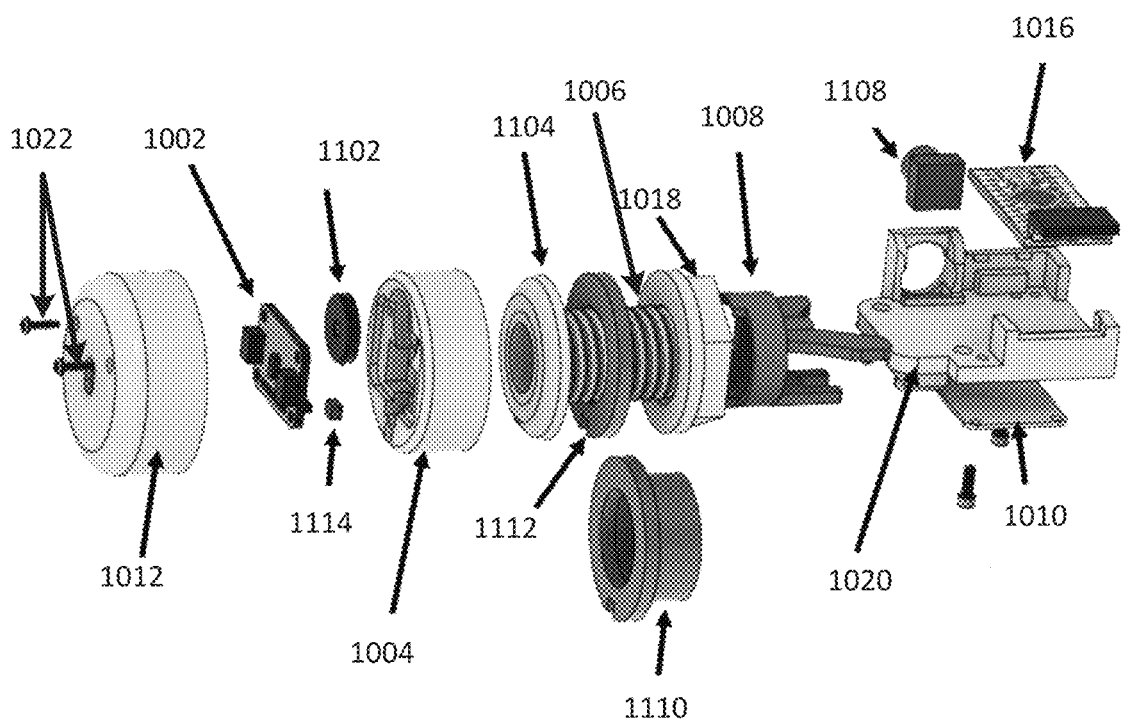
Figure 12:
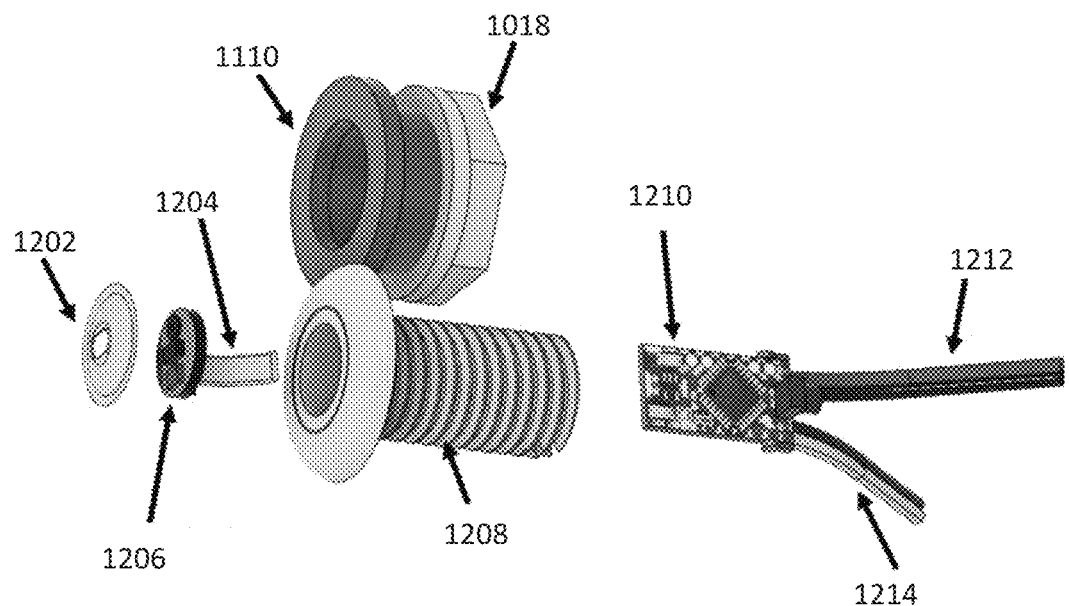

Referring now to FIGS. 10-12, there is shown exploded views of an exemplary touchless button. In these figures, like element numbers indicate identical or functionally similar elements. In particular, FIG. 10 shows a time of flight sensor 1002. An electronics sled 1004 serves as the anchor point for the sensor housing cap 1012 and snaps in place on top of the button housing 1006. The button housing 1006 can be 3D printed to fit custom hole sizes, or can be modified off the shelf. Happ buttons can also be used. The sensor housing cap 1012 can be semi-transparent, and can be held in place by screws 1022. A relay holder clip 1008 can have the same mount configuration as standard Happ button switch holders. A relay board 1010 conveys signals from the sensor 1002, and a relay holder plate 1020 snaps into place on the relay holder clip 1008 or can attach into a standard Happ button switch mount clip. A button housing nut 1018 can be 3D printed for custom hole sizes, or nuts with off the shelf Happ buttons can also be used. A microcontroller 1016 snaps in place on the electronics sled 1004. A mount hole 1014 is positioned in the electronics sled 1004 for placement of an LED (1114 of FIG. 11) to provide a visual cue of proximity (through the semi-transparent cap 1012).

Referring now to FIG. 11, there is again shown, as in FIG. 10, a sensor housing cap 1012, screws 1022, a time of flight sensor 1002, an electronics sled 1004, a button housing 1006, and a button housing nut 1018. FIG. 11 further shows the FIG. 10 elements of a relay holder clip 1008, a relay board 1010, a relay holder plate 1020, and microcontroller 1016. FIG. 11 also shows a piezo speaker 1102 to provide audible feedback and a multi-color micro LED 1114 to provide visual feedback. A three-fourths inch diameter button core 1104 and a sizing washer 1112 for a three-fourths inch diameter hole are shown proximate to the button housing 1006. An alternative sizing washer 1110 flanged for a one inch diameter hole has an inner diameter that fits the three-fourths inch button core 1104. A trimpot 1108 can be used for setting an effective sensor range.

Referring now to FIG. 12, there is shown the FIG. 10 element of a button housing nut 1018. FIG. 12 additionally shows a sensor cover cap 1202 and an input/feedback circuit board 1206 that houses a time of flight distance sensor 1002, a multi-color LED 1114, and a micro piezo speaker 1102 (as shown in FIG. 11). A cable 1204 connects the input/feedback circuit board 1206 to a logic board 1210, which in turn has a power-in cable 1212 and cables 1214 connecting a relay on the logic board to a device to be controlled. The logic board 1210 snaps inside the button core 1208. The button core 1208 fits into existing button housing holes and makes use of an exemplary sizing washer 1110 to fit larger diameter holes.

Figure 13:
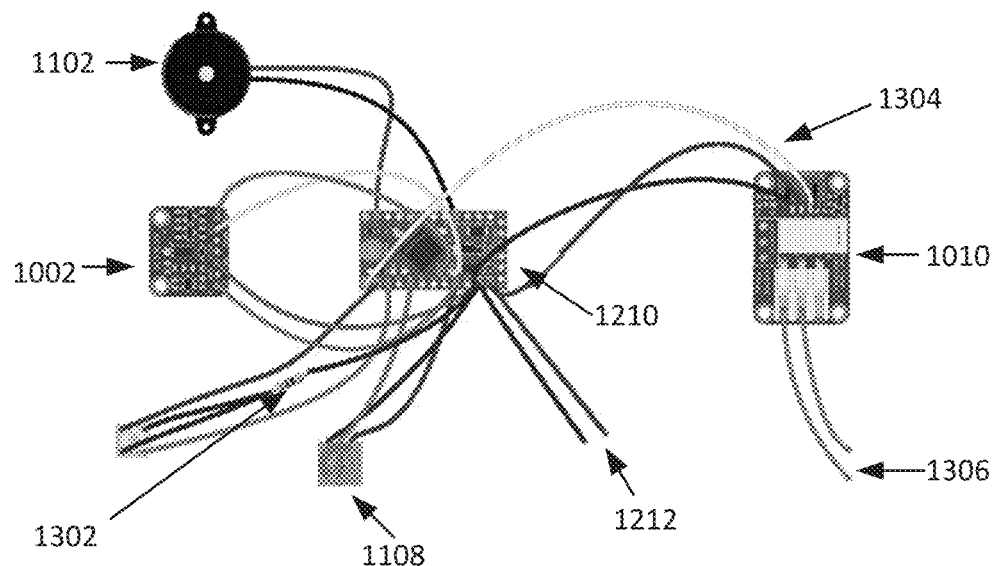
FIG. 13 illustrates the electrical components and wiring of an exemplary replacement touchless button.

FIG. 13 shows the electrical components and wiring of an exemplary touchless button, including components and wiring as shown in FIGS. 10-12. In particular, FIG. 13 shows the previously disclosed elements of a time of flight sensor 1002, a relay board 1010, a micro piezo speaker 1102, a trimpot 1108, a logic board 1210, and a power-in cable 1212. There is also shown a single 82 ohm current limiting resistor 1302 in line with the negative LED leads. Three wires 1304 going into the relay 1010 have a JST PH 3-pin female connector on them. The wires 1306 are typically connected to standard Happ buttons.

The cable connecting the electronic components in the cap of the invention (currently referred to as the sensing and feedback components) is fed through the button housing. The housing is tightened in the place of the previous push button. The logic board 1210 and relay 1010 (currently referred to as the trigger components) which reside on a mounting plate, are snapped into place. The cabling from the sensing and feedback components is connected to the trigger components. A low voltage source (not shown) is connected to the trigger components via wires 1212. This power source provides power to all components of the invention. The wires which led to the previously installed push button are attached to the relay on the trigger component mounting plate.

The housing portion of the button, as shown in FIGS. 2-6 contains or supports all of the electrical components need for the button to function. The button is topped with a cap in a form such as to provide a visual, audible, or haptic cue that serves to indicate that the button has been activated for triggering an action, such as turning on a function. Accordingly, light, sound, and/or haptic output electrical components are included for providing feedback to the end user of the button.

The button includes the capability for adjusting the button diameter to allow for fit into mounting holes (orifices) of various sizes and for providing adjustment of the intensity of the user feedback. Hardware, similar to that on existing pushbuttons, is provided on the button as needed to secure the structure of the button into its use location. The button can include other structural components that support or house needed electrical components for the application of the button, including electrical connections connecting the touchless button to a power source. There are also included electrical connections for connecting electronics housed near the top of the button to a device that had been activated or controlled the replaced physical push button. Alternately, the touchless button can activate or control the device wirelessly.

As a person, object, hand, hand-held pointer, or prosthetic (collectively referred to as a "solid object") approaches the touchless button, an audible tone and visible light will activate. As the solid object approaches the button the light and audible tone will change corresponding to the distance of the solid object. When the solid object reaches a predetermined distance, optionally set by the installer of the button or predetermined, the light, audible tone, and/or haptic signal can change to indicate a touchless button press. At this time the relay on the touchless button will activate the action previously activated by the push button. The distance triggering for activating the button can be tuned by installers or staff to maximize the effectiveness of the touchless triggering.

Embodiments of this technology can be utilized in conjunction with retrofitting panels or boxes with proximity sensors and electronics, snap in place housings with interface which fit existing push button holes, application or smart device-enabled interface systems, stylus (one for each user/visitor/person in a public or private space) used to depress existing push buttons without skin contact, suspended proximity sensors under which a user stands to activate, gesture sensing inputs, eye tracking inputs, phrase or speech activated triggers, virtual holographic buttons.

The technologies disclosed in this application provide further benefits over existing technologies in that it does not need physical modification of most existing push button openings to be implemented. The logic board, sensors and light indicators require no network or wireless connection. Other than the existing push button contact wires, only a low voltage power source is needed to retrofit the existing pushbutton with this touchless option. However, many LED equipped buttons will already have compatible low voltage power connections. This technology improves on the following deficiencies: push buttons can serve as a vehicle for germ transmission, gesture-based solutions require educating the users of functional gestures and any associated gesture variations, application-based solutions require infrastructure and connection via wireless interfaces to personal devices as well as the technical challenges and financial factors that go along with these systems, such as up-front infrastructure cost or software subscription cost.

Additional benefits of embodiments of the disclosed replacement touchless button include:

The touchless button can provide a direct size fit replacement for existing push buttons, with little or no modification of the button housing board or plate.

The touchless button taps into existing trigger wiring and can be powered by low-voltage power sources, including AC/DC converters and USB sources.

Some embodiments of the replacement touchless button mimic existing arcade style push buttons in size and shape, creating a relatively intuitive interface.

The audible and the visual feedback compliment the physical size and shape of the touchless button, increasing the likelihood of intuitive use by the general public.

The proximity sensor can allow for a narrow touchless contact point while also providing installers or overseers of the hardware the ability to fine-tune the distance of the trigger zone from 10 cm to 1 m.

The current design can utilize sizing washers to fit any button hole, ranging from 19.5 mm in diameter up to 35 mm in diameter.

The disclosed technology differs from present solutions in that it does not need physical modification of most existing push button openings to be implemented. The logic board, sensors, and light indicators of the touchless button require no network or wireless connection. All sensing logic and switching components are housed on or within the structure of the touchless button. Other than the existing push button contact wires, only a low voltage power source is needed to satisfy the electrical requirements needed to retrofit the existing push button with this touchless option.

Application of this replacement technology can be extended to activation buttons of many applications, such as including but not limited to: handicap access buttons, elevator call buttons, museum exhibit buttons, standardized interface for anything (including existing devices such as bathroom fixtures), doorbell buttons, vending machine buttons, light switches, hospital call buttons, (no bend) input for hard to reach spaces (under furniture or fixtures, under a tree, in tight spaces, around a corner), video content switching and selection.

Alternate technologies and applications that can benefit from this technology include multi-sensor gesture-based inputs, proximity sensor panels, application-enabled phone interface with integrated connectivity solutions, holographic control interface, motion tracking input interface, eye tracking input interface, thermal sensor interface push buttons, and capacitive touch interface.

The core technology of the touchless button can also be used for elevators, doorbells, door monitors, computer interfaces and controls, and any other interface where people historically touched a button, exposing them to transfer of viruses and bacteria. Other, nonexclusive, examples of uses for the touchless button include museum display buttons; non contact fine point machine/equipment proximity stop; no touch automatic door trigger; touchless call button in a medical setting or a retail setting; touchless demo button in a display or retail setting; touchless fine point customer presence trigger for a hotel desk that uses the feedback as both adaptive and to indicate that their presence at the hotel desk is noticed; fine point proximity to notify if someone is close to a person, object, or equipment; an upgrade component as a replacement install for any type of push button control; to notify store staff of persons' fine point presence near a particular product without use of a cell phone data or connection; and a trigger for an area or surface that is not desirable to touch due to its proximity to hazardous products.

The foregoing descriptions of specific exemplary embodiments of the present invention have been presented for purposes of illustration and description. They are not intended to be exhaustive nor to limit the invention to the precise forms disclosed, and obviously many modifications and variations are possible in light of the above teachings. The exemplary embodiments were chosen and described in order to explain certain principles of the invention and their practical application, to thereby enable others skilled in the art to make and utilize various exemplary embodiments of the present invention, as well as various alternatives and modifications thereof. It is intended that the scope of the invention be defined by the Claims appended hereto and their equivalents.

What is claimed is:

1. A method for providing a replacement touchless button for initiating an action, comprising:

identifying a push button configured to initiate an action, wherein the identified push button completes an electrical circuit for initiating the action;

determining a diameter of an orifice in which the push button is housed;

determining a diameter of a identified touchless button;

determining a sizing washer for covering the space between an outside wall of the selected touchless button and an inside wall of the orifice, wherein the sizing washer comprises a central opening sized to accept the touchless button;

placing the touchless button into the central opening of the sizing washer;

placing the touchless button in the orifice, wherein the sizing washer covers the space between the outside wall of the touchless button and the inside wall of the orifice; and connecting the touchless button with the electrical circuit.

2. The method of claim 1, further comprising:

sensing the proximity of a solid object within an adjustable distance from the top of the touchless button;

upon sensing the proximity of the solid object within the adjustable distance, activating a feedback for notifying a user that the touchless button has been activated;

wherein the solid object can include a user hand; and wherein the activated feedback can be one or more of a light, audible, or haptic signal.

3. The method of claim 2, wherein the adjustable distance from the top of the touchless button can be fined tuned to adjust the distance between the solid object and the top of the touchless button for activation of the touchless button.

4. The method of claim 2, further comprising:

upon sensing the proximity of the solid object within the adjustable distance, activating circuitry or logic within the touchless button to send a signal controlling a device located external to the touchless button.

5. The method of claim 1, wherein placing the touchless button in the orifice requires no modification of the orifice and no modification of a panel in which the touchless button is to be located.

6. The method of claim 2, wherein the touchless button connects to existing panel wiring, using existing connections, with no modifications to the panel wiring or existing connections.

7. The method of claim 1, wherein the electrical circuit provides existing low voltage power to the touchless button.

8. The method of claim 1, wherein the appearance of the touchless button to a user mimics arcade style push buttons in size and shape.

* * * * *